United States Patent [19]

Ward et al.

[11] Patent Number: 5,571,447
[45] Date of Patent: Nov. 5, 1996

[54] STRIPPING AND CLEANING COMPOSITION

[75] Inventors: Irl E. Ward, Bethlehem; Francis Michelotti; Leslie D. Molnar, both of Quakertown, all of Pa.

[73] Assignee: Ashland Inc., Dublin, Ohio

[21] Appl. No.: 407,202

[22] Filed: Mar. 20, 1995

[51] Int. Cl.$^6$ .............................. C11D 7/08; C11D 7/50; C09K 13/08; G03F 7/30
[52] U.S. Cl. .................... 510/206; 430/331; 510/188
[58] Field of Search ..................... 252/153, 170, 252/171, DIG. 8, 79.3, 143, 146, 151; 430/331

[56] References Cited

U.S. PATENT DOCUMENTS

| | | | |
|---|---|---|---|
| 3,979,241 | 9/1976 | Maeda et al. | 156/13 |
| 4,230,523 | 10/1980 | Gajda | 156/657 |
| 4,343,677 | 8/1982 | Kinsbron et al. | 156/643 |
| 4,871,422 | 10/1989 | Scardera et al. | 156/662 |
| 4,921,626 | 5/1990 | Rhodenbaugh | 252/79.3 |
| 5,320,709 | 6/1994 | Bowden et al. | 156/667 |
| 5,417,877 | 5/1995 | Ward | 252/153 |

FOREIGN PATENT DOCUMENTS 8801254 7/1988 Rep. of Korea.

*Primary Examiner*—Linda Skaling Therkorn
*Attorney, Agent, or Firm*—John Lezdey

[57] ABSTRACT

A stripping and cleaning composition is provided which contains a polyhydric alcohol, fluoboric acid, a fluorine containing compound and a polar solvent. The pH of the composition is less than 5. Also provided is a method of stripping and cleaning utilizing the compositions of the invention.

5 Claims, 4 Drawing Sheets

STRIPPING AND CLEANING COMPOSITION

FIELD OF THE INVENTION

The invention relates generally to a stripping composition having a controlled oxide etch and sidewall polymer removal capability and to a process for stripping and etching utilizing the composition. More particularly, the invention provides an acidic stripping composition containing fluoboric acid which is free of ethylene glycol and hydrogen fluoride.

BRIEF DESCRIPTION OF THE PRIOR ART

Hydrogen fluoride has been widely used in etching processes for patterning films on semiconductor wafers. Hydrogen fluoride has very high etching rates, and therefore a number of alternatives to hydrogen fluoride have been developed. Kinsbron et al, U.S. Pat. No. 4,343,677 discuss film patterning and disclose an etching solution which uses buffered ammonium fluoride/hydrofluoric acid in a molar ratio of about ten to one, mixed with a suitable solvent such as ethylene glycol. Gajda, U.S. Pat. No. 4,230,523, discloses an etchant comprised of a solution of hydrogen fluoride dissolved in organic solvents such as glycerine or another polyhydric alcohol. The etchant is used for etching silicon dioxide while not attacking silicon. Gajda requires that the solution be free of unbound water and ammonium fluoride. Maeda et al, U.S. Pat. No. 3,979,241, teach an etching liquid with ammonium fluoride or an alkali fluoride dissolved in a polyhydric alcohol, such as ethylene glycol, polyethylene glycol, and glycerine. The etching solution is used for selectively etching silicon dioxide or silicon nitride on a semiconductor wafer.

U.S. Pat. No. 5,320,709 to Bowden et al discloses a composition for selectively removing oxidized organometallic residues, oxidized organosilicon residues and oxides with a composition which is essentially neutral and comprises a polyhydric alcohol and an anhydrous ammonium fluoride salt. The present invention provides a specific improvement over the compositions of this patent by utilizing aqueous fluoboric acid and having an acidic pH.

SUMMARY OF THE INVENTION

The present invention provides a stripping composition for the removal of organic materials, organometallic residues, organosilicon residues and inorganic residues which has a controlled oxide etch rate. The composition comprises:

a) about 60 to 85% by weight of a polyhydric alcohol having the formula selected from the group consisting of $HO[CH_2\text{-}CH_2O]_nH$ and

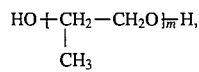

wherein n is greater than 1 and m is 1 or more;

b) about 5 to 40% by weight of a polar solvent;

c) about 0.5 to 10% by weight of fluoboric acid; and d) the remainder being a fluorine containing compound selected from the group consisting of $NR_4B_xF_{3x+1}$, $NR_xF_y$, $H_xZF_y$, $H_2PFO_2$ and $MF_x$, wherein R represents hydrogen or lower alkyl,
Z presents Si, $SO_3$ or P;
x is an integer of not more than 4;
y is 0 to 6;
M is an alkali or alkaline earth metal, and
said composition having a pH less than 5.

The compositions of the inventions are suitable for both VIA and contact hole applications as well as connector lead/multi-layer metal stack applications due to their high resistance to metal and metal alloy corrosion.

Preferably, the polar solvent is water and/or dimethylsulfoxide.

Advantageously, the compositions of the invention are free of ethylene glycol and hydrofluoric acid.

The compositions of the invention advantageously contain a corrosion inhibitor.

It is a general object of the invention to provide a stripping composition having a controlled etch and sidewall polymer removal capability.

It is another object of the invention to provide a stripping composition which is free of ethylene glycol and hydrofluoric acid.

It is yet another object of the invention to provide a stripping composition which is water soluble having high resistance to metal corrosion.

It is still another objection of the invention to provide a method for stripping which provides for a controlled oxide etch.

DESCRIPTION OF THE PREFERRED EMBODIMENTS

Figure 1:
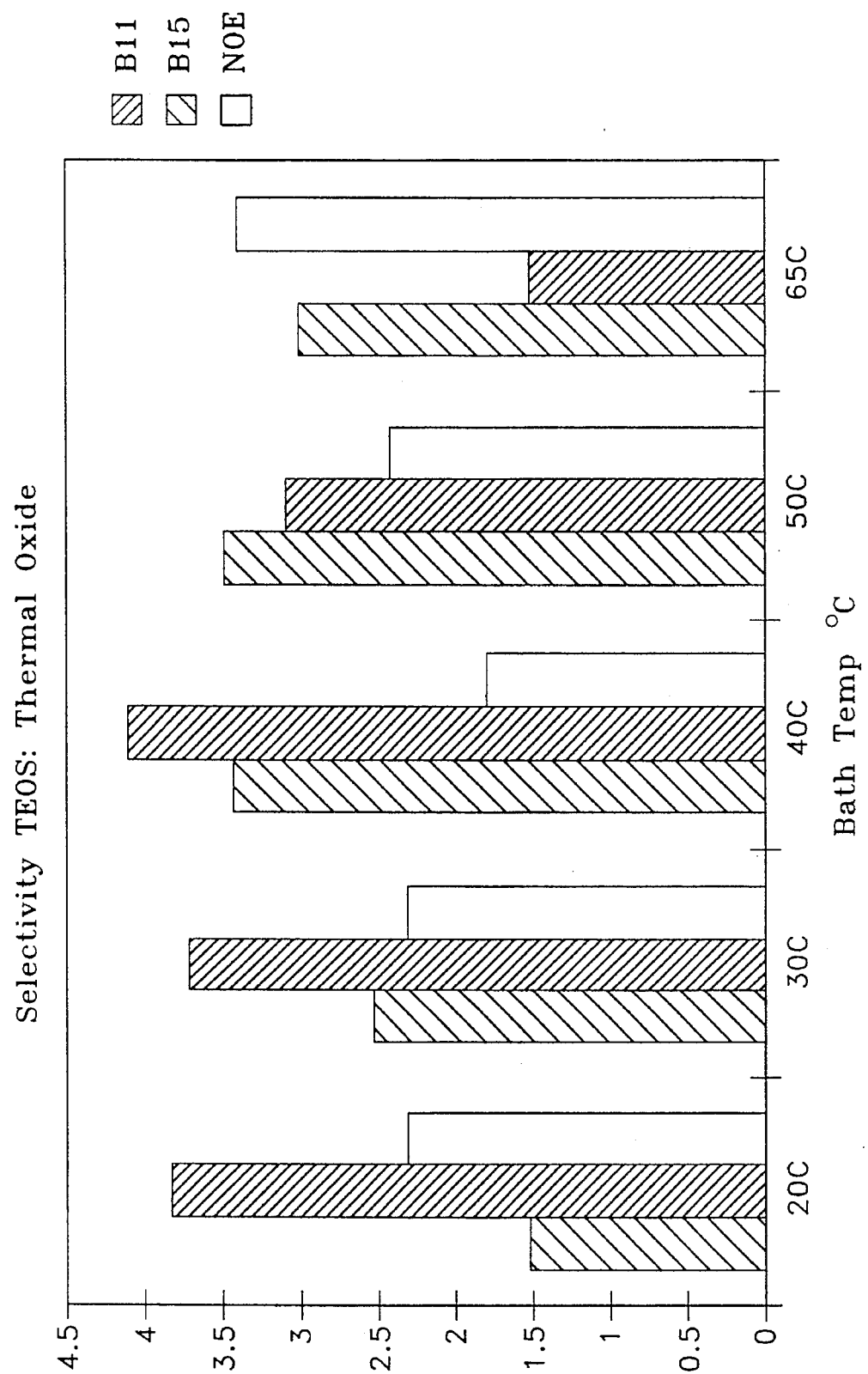
FIG. 1 illustrates that the overall selective etching of the compositions of the invention with respect to tetraethylorthosilcate (TEOS) vs. silicon is superior over a wide range of temperatures.

The present invention is directed to a stripping and cleaning composition comprises a polyhydric alcohol having the formula selected from the group consisting of $HO[CH_2\text{-}CH_2O]_nH$ and

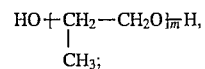

wherein n is greater than 1 and m is 1 or more, fluoboric acid (HBF$_4$), a polar solvent which is preferably water and/or dimethylsulfoxide, and a fluorine containing compound selected from the group consisting of $NR_4B_xF_{3x+1}$, $NR_xF_y$, $H_xZF_4$, $H_2PFO_2$ and $MF_x$;
wherein R represents hydrogen or lower alkyl;
Z represents Si, $SO_3$ or P;
x is an integer of not more than 4;
y is 0 or 6;
M is an alkali or alkaline earth metal; and
the composition has a pH less than 5. Advantageously, the composition contains a corrosion inhibitor which forms a 5- or 6- membered ring coordination complex with a metal substrate as described in copending application Ser. No. 07/983,257 now U.S. Pat. No. 5,417,877.

Fluoboric acid is commercially available in a 50% aqueous solution.

The stripping compositions of the present invention are particularly suitable for removing organic or inorganic material from a substrate such as sidewall polymers (SWP) and/or for controlled etching of contaminated or uncontaminated oxide surfaces. The composition are also effective in removing many forms of resist ash and etch residues without the presence of hydrogen fluoride.

The stripping and cleaning compositions of the invention contain about 60 to 85% by weight of composition of a polyhydric alcohol which excludes ethylene glycol, for example propylene glycol, glycerol, polyethylene glycol, etc.

Fluoboric acid in an amount of about 0.5 to 10% by weight of composition is an essential component of the composition. Fluoboric acid maintains a stable fluoride ion source with ammonium fluoride or other fluoride salts and provides the needed low pH of the compositions.

Polar solvents which can be used in the invention include water, dialkylsulfoxide (dimethylsulfoxide), N-substituted pyrrolidone, aliphatic amides, aliphatic esters, lactates, cyclic lactones, and the like.

The use of about 5 to 40% by weight of a polar solvent, especially water and/or dimethylsulfoxide (DMSO), together with a polyhydric alcohol other than ethylene glycol, surprisingly stabilizes the performance of the formulations and enhances their process latitude. The use of water alone or with DMSO as the solvent allows use of ammonium fluoride in the formulation when propylene glycol is the polyhydric alcohol.

The fluorine containing compounds in the compositions provide the fluoride ion source resulting in the desired etching action. The fluorine containing compounds which may be used include ammonium fluoride, ammonium tetrafluoroborate, fluorosilicic acid, trifluoroacetic acid, hexafluorophosphoric acid, fluorophorsphoric acid, fluorosulfonic acid, tetraalkylammonium tetrafluoroborate, ammonium bifluoride, sodium fluoride, etc. The amount of fluorine containing compound is about 0.1% ($^w/_w$) to 10% ($^w/_w$), preferably between about 0.5 to 2.0% ($^w/_w$).

Corrosion inhibitors in an amount of up to about 15% by weight can be added to the stripping compositions. Preferably, the inhibitor concentration is from about 2 to 8% by weight, and most preferably, about 5% by weight. Suitable inhibitors are disclosed in copending application Ser. No. 07/983,257 to Ward filed Nov. 30, 1992, now U.S. Pat. No. 5,417,877 which is herein incorporated by reference. The inhibitor is a compound selected from the group consisting of:

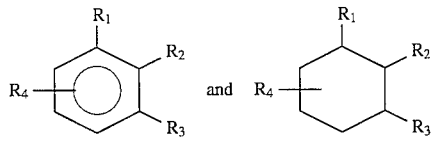

wherein $R_1$, $R_2$, $R_3$ and $R_4$ are the same or different and each represent H, OH, $NHR_5$, $CO_2R_6$, $COR_7$ and SH, wherein $R_5$ and $R_6$ are the same or different and each represent H or lower alkyl, and $R_7$ represents lower alkyl, with the proviso that when $R_4$ is H, not more than one of $R_1$, $R_2$ and $R_3$ is the same as $R_4$, and when $R_3$ is not H, not more than one of $R_1$, $R_2$ and $R_4$ is hydrogen, the remainder being the same or different than $R_3$. Preferred inhibitors include catechol, pyrogallol, anthranilic acid, gallic acid, gallic esters, and the like.

The stripping compositions of this invention are especially useful and advantageous for numerous reasons among which may be mentioned the following. The stripping compositions are water soluble, non-corrosive to substrate, non-flammable and of low toxicity to the environment. The stripping compositions evidence high stripping efficiency at low temperatures for a wide variety of coating residues and substrates. The stripping compositions are particularly suitable for removal of residues from plasma processing used in integrated circuit fabrication since they also prevent the redeposition of metal ions, especially sodium and potassium ions.

The process of the invention is carried out by contacting a substrate containing an organic or metal-organic polymer, inorganic salt, oxide, hydroxide or complex or combination thereof as a film or residue, (e.g. sidewall polymer (SWP)), with the described stripping composition. The actual conditions, e.g., temperature, time, etc., depend on the nature and thickness of the complex (photoresist and/or SWP) material to be removed, as well as other factors familiar to those skilled in the art. In general, for stripping, the substrate is contacted or dipped into a vessel containing the stripping composition at an elevated temperature, preferably between 25°–80° C. for a period of about 1–15 minutes and then washed with water.

Representative organic polymeric materials include positive photoresists, electron beam resists, X-ray resists, ion beam resists, and the like. Specific examples of organic polymeric materials include positive resists containing phenolformaldehyde resins or poly (p-vinylphenol), polymethylmethacrylate-containing resists, and the like. Examples of plasma processing residues side wall polymers (SWP) include among others, metal-organic complexes and/or inorganic salts, oxides, hydroxides or complexes which form films or residues either alone or in combination with the organic polymer resins of a photoresist. The organic materials and/or SWP can be removed from conventional substrates known to those skilled in the art, such as silicon, silicon dioxide, aluminum, aluminum alloys, copper, copper alloys, etc.

Examples illustrating the removal of a coating from a substrate under varying conditions are described further below. The following examples are provided to further illustrate the invention and are not intended to limit the scope of the present invention.

Examples of compositions according to the invention are set forth below in Table I. The amounts indicated are in percent by weight of composition.

TABLE I

| Stripping Compositions | Propylene Glycol (wt %) | $HBF_4$ (wt % 50% sol) | DMSO (wt %) | $H_2O$ (wt %) | Fluorine Containing Compound (wt %) | Inhibitor (wt %) |
|---|---|---|---|---|---|---|
| A | 77.0% | 5.0% |  | 17.0% | $NH_4F$ (1.0%) |  |
| B | 73.5% | 5.0% | 20.0% |  | $NH_4F$ (1.5%) |  |
| C | 70.9% | 5.0% | 15.0% |  | $NH_4F$ (1.5%) | Cathecol 5.0% |
| D | 76.0% | 5.0% | 18.5% |  | $NH_4BF_4$ (0.5%) | Cathecol 5.0% |

TABLE I-continued

| Stripping Compositions | Propylene Glycol (wt %) | HBF$_4$ (wt % 50% sol) | DMSO (wt %) | H$_2$O (wt %) | Fluorine Containing Compound (wt %) | Inhibitor (wt %) |
|---|---|---|---|---|---|---|
| E | 78.5% | 5.0% | 20.0% | | NH$_4$F (1.5%) | Cathecol 5.0% |
| F | 71.25% | 5.0% | 20.0% | | NH$_4$F (3.75% 40% aq.) | |

Example I

Example 1 illustrates the removal of a photoresist from a substrate using a stripping composition of the invention.

More specifically, an immersion tank containing composition A of Table I is held at room temperature and the stripping composition is recirculated at an exchange rate of about 1.0 (i.e. pump flow rate/bath volume ≅1.0).

A rinse tank with standard overflow cascade containing deionized water with a CO$_2$ sparge is also prepared.

The photoresist wafer specimen is immersed into the stripping composition for 1–20 minutes in accordance with the oxide etch rate and the amount of removal desired.

The specimen is removed from the stripping bath and immersed into the rinse tank for 2–4 minutes using continuous CO$_2$ sparging.

The specimen is then removed and spun dry in a heated nitrogen atmosphere.

Example 2

A comparative study was performed with compositions A and B of Table I and a formulation of Pat. No. 5,320,709 having the following formulation:

| Ethylene glycol | (4.2–4.8%) |
|---|---|
| Ammonium fluoride | |
| H$_2$O less than 1% | |

Figure 2:
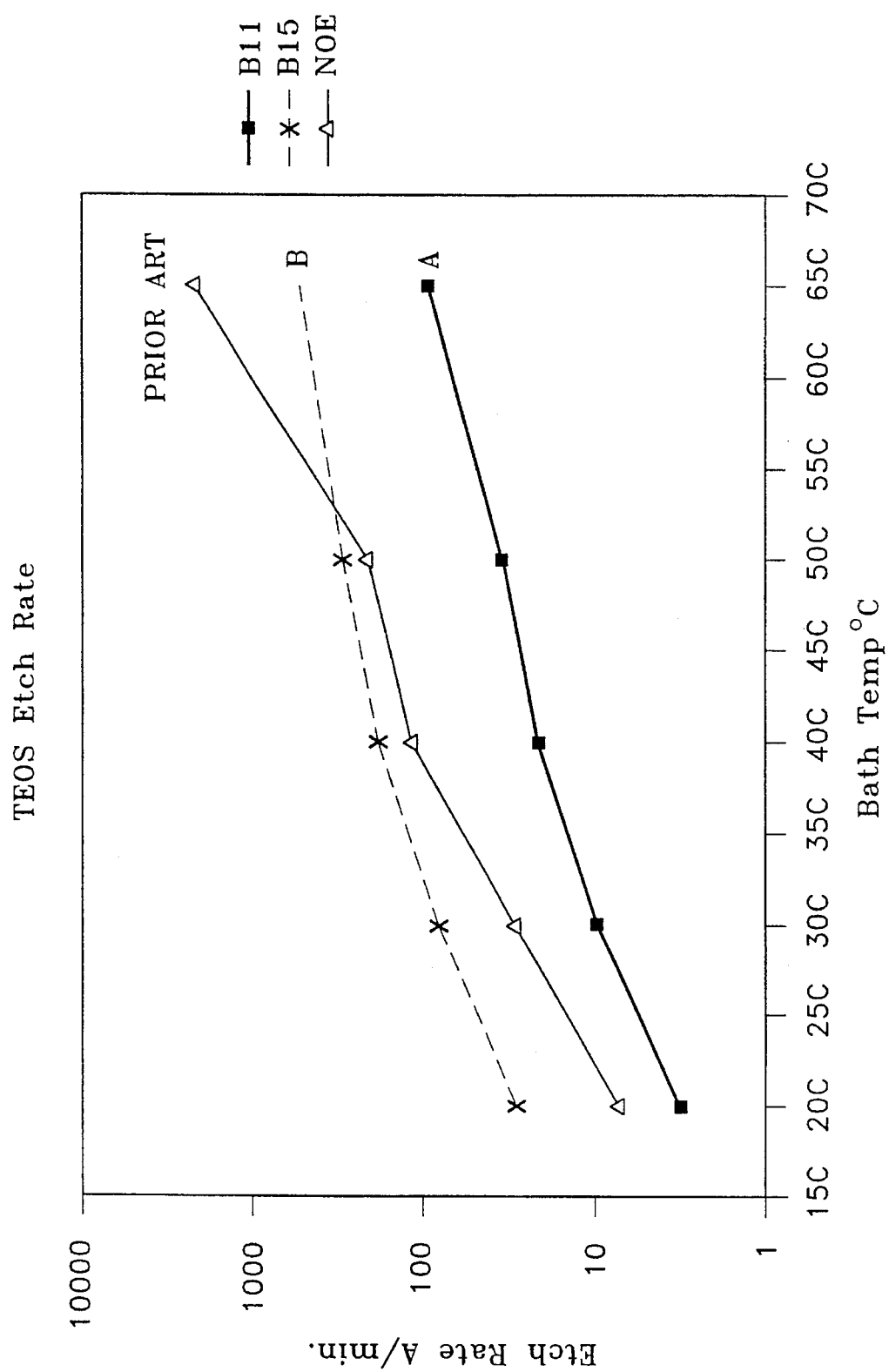
FIGS. 2–4 illustrate that the process is superior to the formulation described in Pat. No. 5,320,709.
Figure 3:
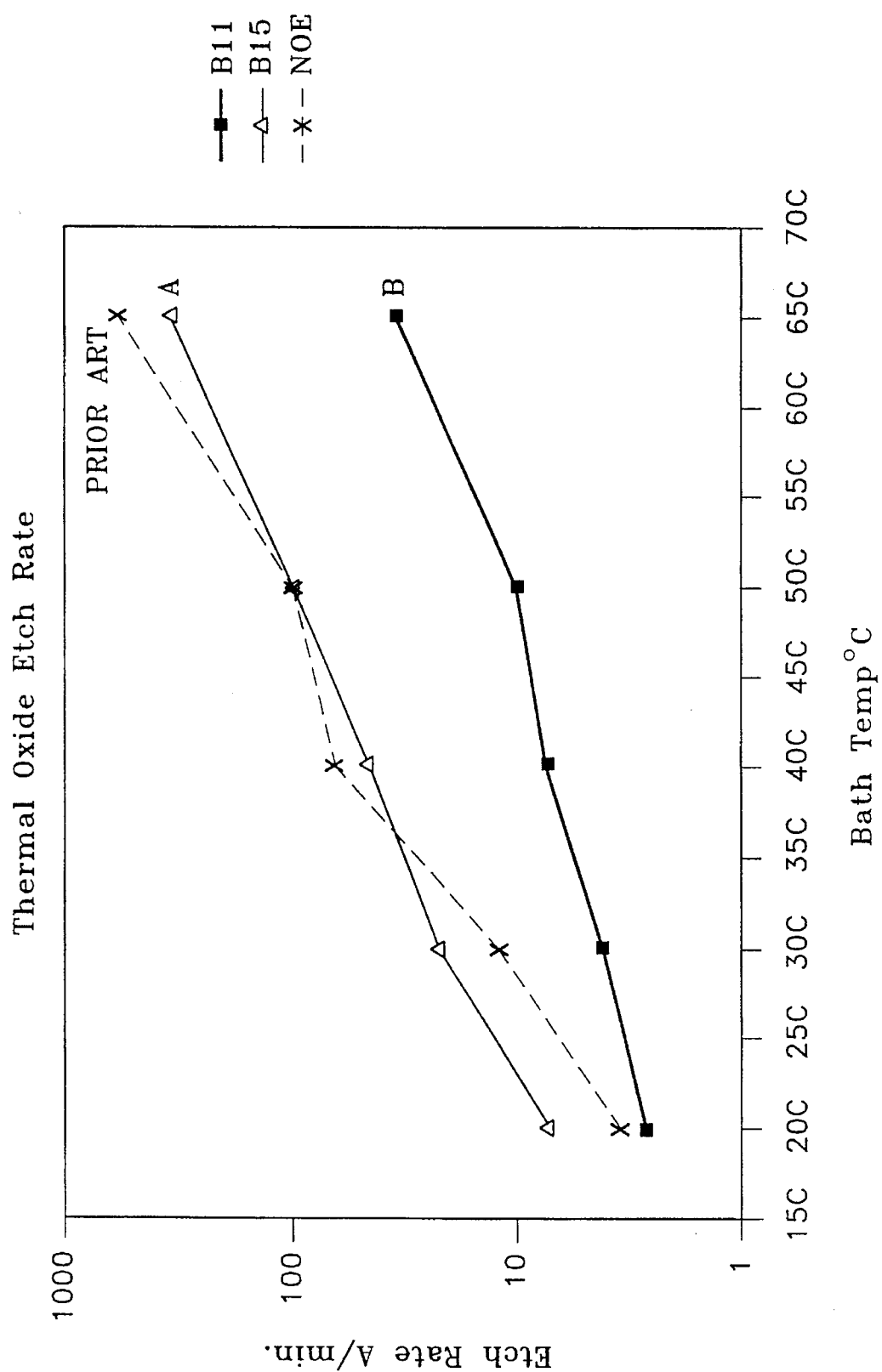
Figure 4:
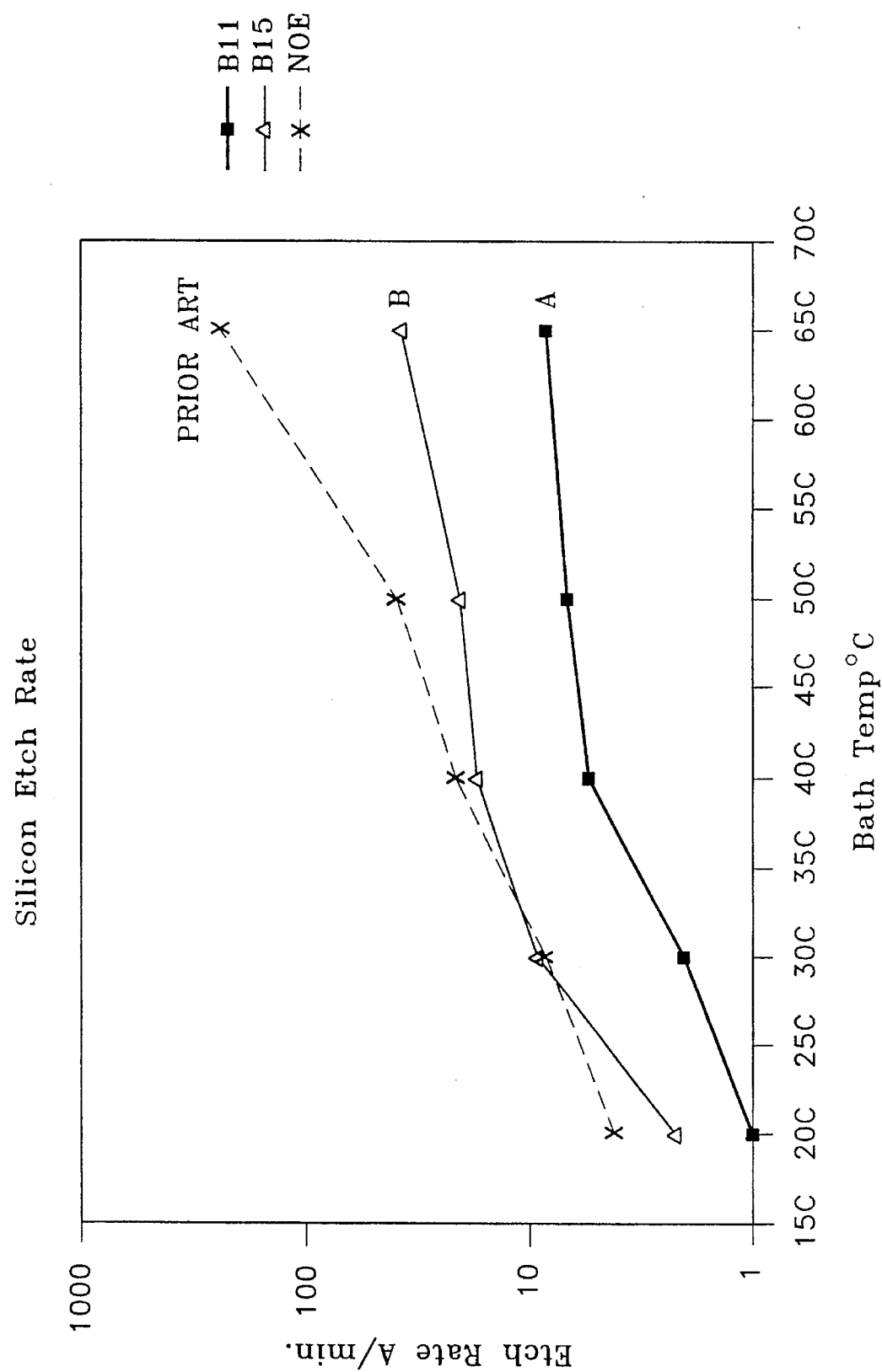

As seen in FIGS. 2 and 3, the process latitude (i.e. change in oxide rate as temperature changes) is much superior with compositions A and B to the prior art formulation.

FIG. 3 shows that compositions A and B have greater etch uniformity with silicon as the temperature increases.

What is claimed is:

1. A stripping and cleaning composition consisting essentially of the admixture of:

(a) about 60 to 85% by weight of propylene glycol;

(b) about 5 to 40% by weight of dimethylsulfoxide;

(c) about 0.5 to 10% by weight of 50% fluoroboric acid;

(d) an effective amount of corrosion inhibitor; and (e) the remainder being ammonium tetrafluoroborate, wherein said composition has a pH less than 5.

2. A stripping and cleaning composition comprising the admixture of:

(a) about 71.0–73.5% by weight of propylene glycol;

(b) about 20% by weight of dimethylsulfoxide;

(c) about 2.5–5.0% by weight of water;

(d) about 1.5% by weight of ammonium fluoride; and (e) about 2.5–5.0% by weight of 50% aqueous fluoroboric acid, wherein said composition has a pH less than 5.

3. A stripping and cleaning composition consisting essentially of the admixture of:

(a) about 77% by weight of propylene glycol;

(b) about 1% by weight of ammonium fluoride;

(c) about 2.5% by weight of 50% aqueous fluoroboric acid; and (d) the remainder being water, wherein said composition has a pH less than 5.

4. The composition of claim 1 wherein said inhibitor is selected from the group consisting of catechol, pyrogallol, gallic acid, anthranilic acid, and mixtures thereof.

5. The composition of claim 1 consisting essentially of about 1.5% by weight of ammonium fluoride, about 20% by weight of dimethylsulfoxide, about 2.5–5.0% by weight of fluoboric acid, about 2.5–5.0% by weight of water and about 71–73.5% by weight of propylene glycol.

* * * * *